United States Patent
Zang

(10) Patent No.: US 9,728,615 B2
(45) Date of Patent: Aug. 8, 2017

(54) FIN SHAPE CONTACTS AND METHODS FOR FORMING FIN SHAPE CONTACTS

(71) Applicant: GLOBALFOUNDRIES Inc., Grand Cayman (KY)

(72) Inventor: Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/740,872

(22) Filed: Jun. 16, 2015

(65) Prior Publication Data

US 2016/0372559 A1  Dec. 22, 2016

(51) Int. Cl.
| | |
|---|---|
| *H01L 29/06* | (2006.01) |
| *H01L 29/417* | (2006.01) |
| *H01L 29/66* | (2006.01) |
| *H01L 29/78* | (2006.01) |
| *H01L 29/08* | (2006.01) |

(52) U.S. Cl.
CPC .... *H01L 29/41791* (2013.01); *H01L 29/0649* (2013.01); *H01L 29/0847* (2013.01); *H01L 29/66545* (2013.01); *H01L 29/66795* (2013.01); *H01L 29/7851* (2013.01)

(58) Field of Classification Search
CPC ......... H01L 21/30604; H01L 21/31144; H01L 29/41791; H01L 29/0649; H01L 29/0847
See application file for complete search history.

(56) References Cited

U.S. PATENT DOCUMENTS

2015/0364574 A1* 12/2015 Kim ................. H01L 29/66545
257/368

* cited by examiner

*Primary Examiner* — Trang Tran
(74) *Attorney, Agent, or Firm* — Heslin Rothenberg Farley & Mesiti P.C.; Jacquelyn A. Graff

(57) ABSTRACT

Semiconductor devices and methods for forming the devices with fin contacts. One method includes, for instance: obtaining a wafer with at least one isolation region; forming at least one fin on the wafer; forming at least one sacrificial contact; forming at least one sacrificial gate; etching to recess the at least one fin; growing an epitaxial material over the at least one fin; performing replacement metal gate to the at least one sacrificial gate; depositing an interlayer dielectric layer; and forming at least one fin contact. An intermediate semiconductor device is also disclosed.

13 Claims, 11 Drawing Sheets

US 9,728,615 B2

1

FIN SHAPE CONTACTS AND METHODS FOR FORMING FIN SHAPE CONTACTS

FIELD OF THE INVENTION

The present invention relates to semiconductor devices and methods of fabricating semiconductor devices, and more particularly, to fin shape contacts and methods for forming fin shape contacts.

BACKGROUND OF THE INVENTION

As semiconductor devices continue to decrease in size, the position and dimension of the fin contacts becomes more crucial. The trench silicide (TS) contact resistance for currently available fin contacts limits the FinFET device performance. In addition, currently available FinFET devices are restricted to specific fin heights. The limitation with regard to fin heights is another performance limiter for FinFET devices. As the contact area for semiconductor devices decreases in size and the fins increase in height, a high resistance is created in the device. Thus, new contact structures and contact formation processes are needed.

SUMMARY OF THE INVENTION

The shortcomings of the prior art are overcome and additional advantages are provided through the provision, in one aspect, a method includes obtaining a wafer with at least one isolation region; forming at least one fin on the wafer; forming at least one sacrificial contact; forming at least one sacrificial gate; etching to recess the at least one fin; growing an epitaxial material over the at least one fin; performing replacement metal gate to the at least one sacrificial gate; depositing an interlayer dielectric layer; and forming at least one fin contact.

In another aspect, an intermediate semiconductor device is provided which includes, for instance: a substrate; at least one fin on the substrate; at least one sacrificial contact overlapping at least a portion of the at least one fin; at least one sacrificial gate positioned adjacent to the at least one sacrificial contact; and an epitaxial growth between the at least one sacrificial contact and the at least one sacrificial gate.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

2

Figure 2:
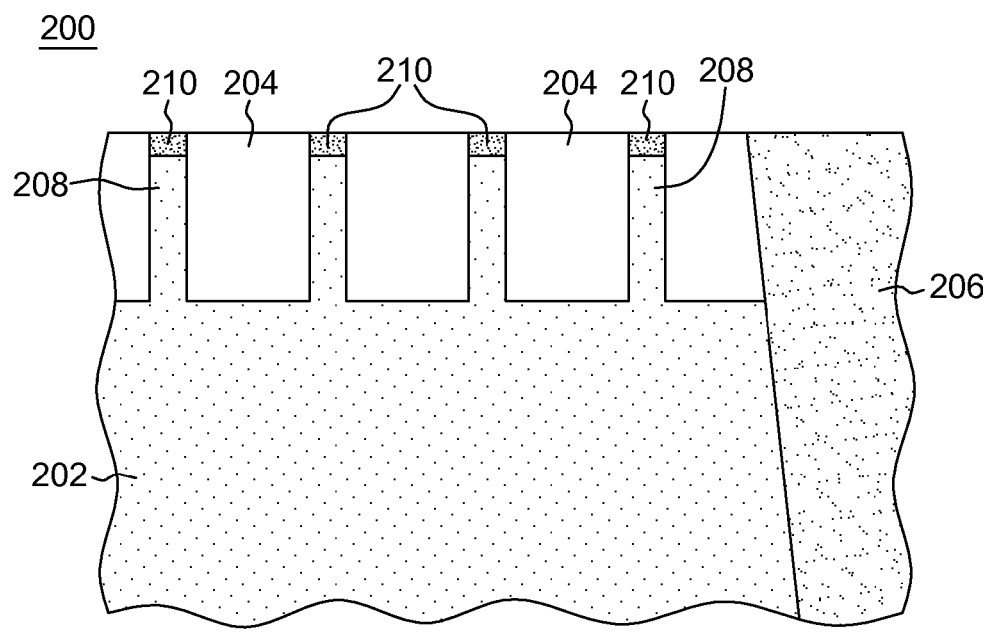
FIG. 2 depicts an cross-sectional elevation view of one embodiment of an integrated circuit with fins disposed over a substrate structure, in accordance with one or more aspects of the present invention.
Figure 3:
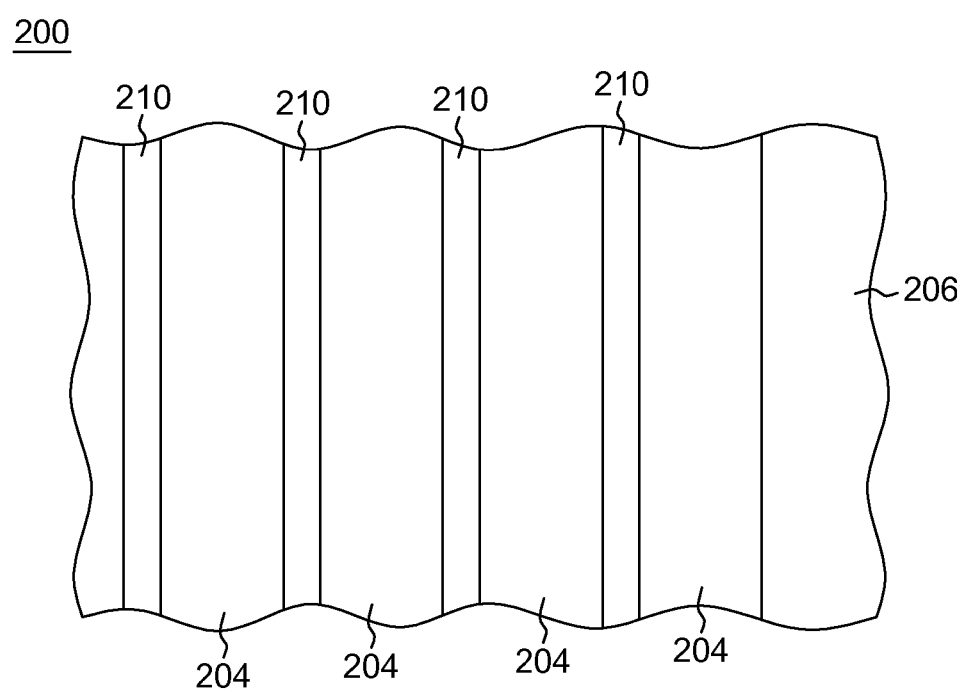
Figure 4:
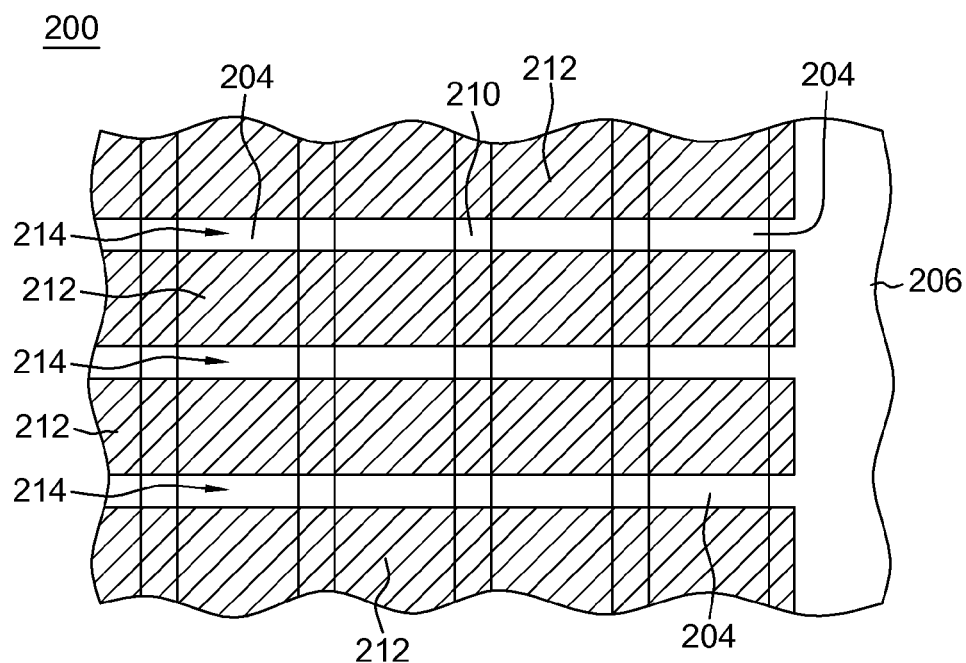
Figure 5:
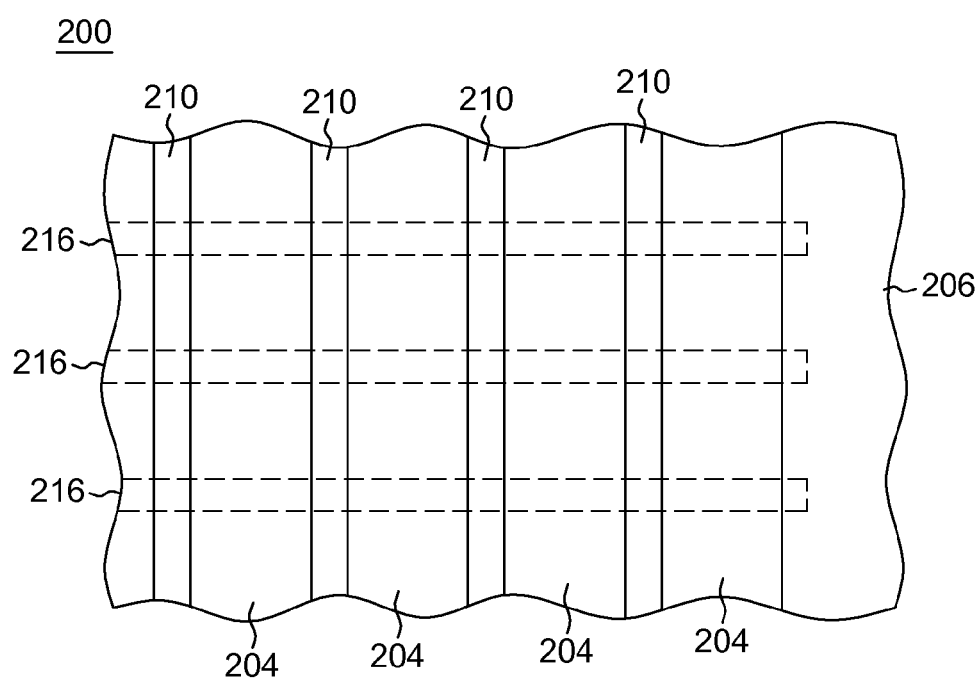
Figure 6:
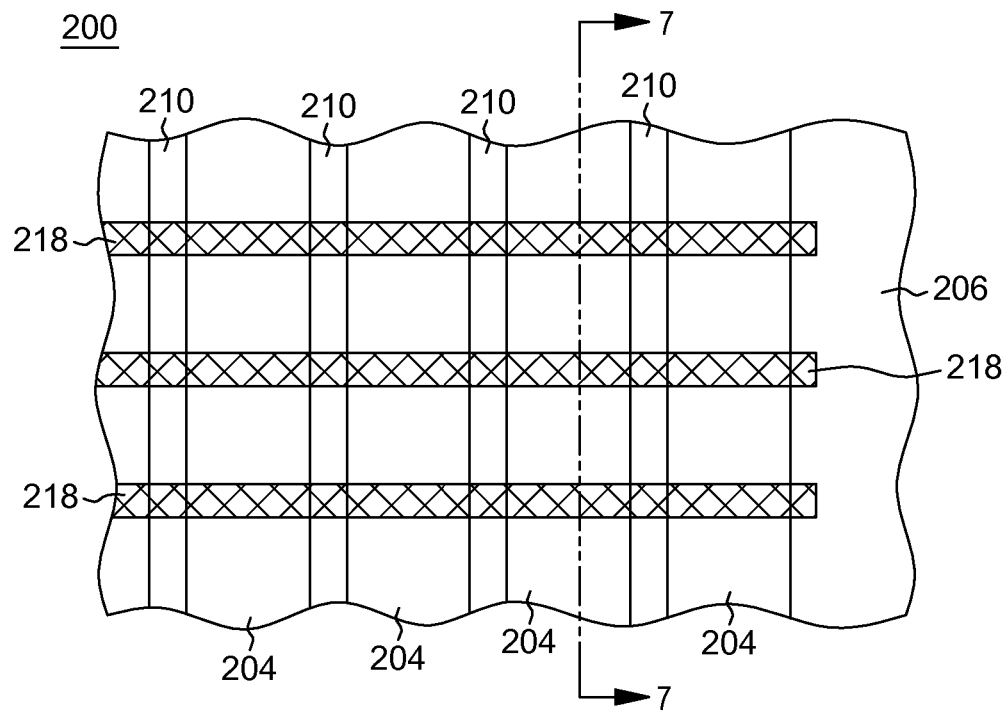
Figure 7:
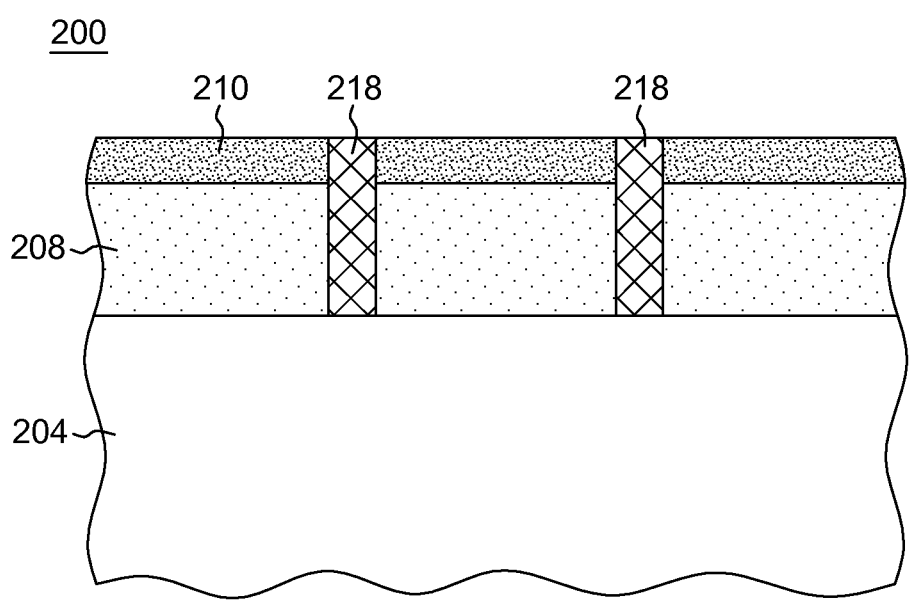
Figure 8:
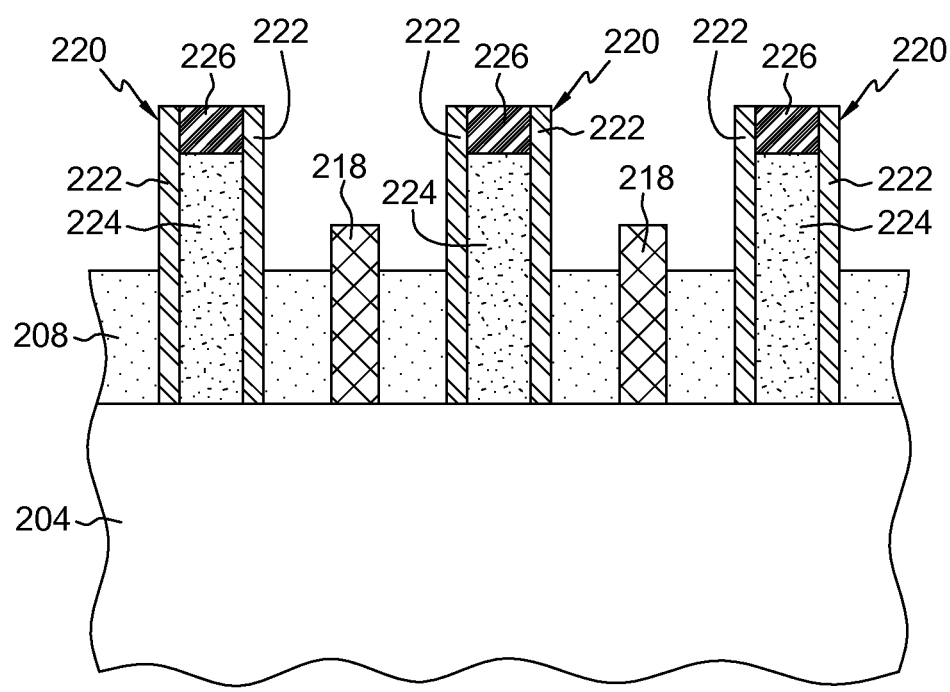
Figure 9:
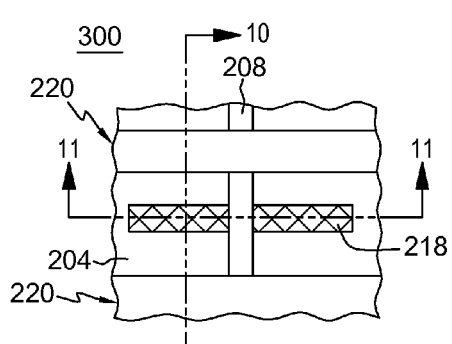
Figure 10:
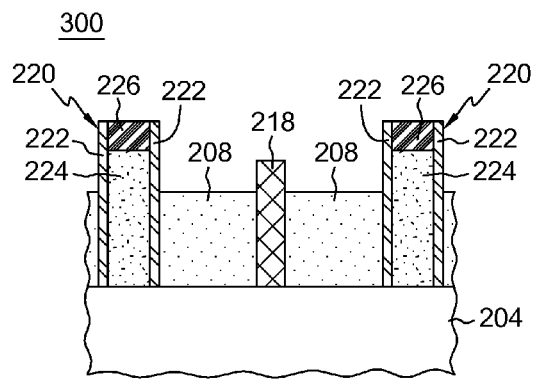
Figure 11:
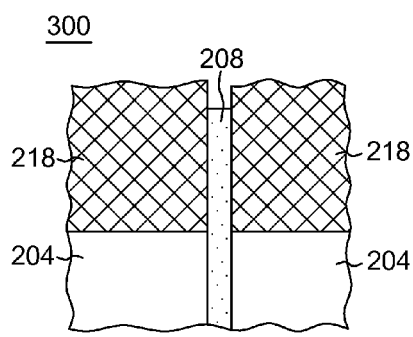
Figure 12:
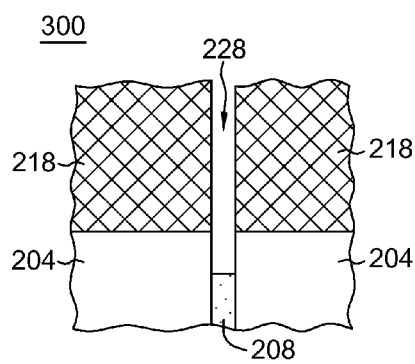
Figure 13:
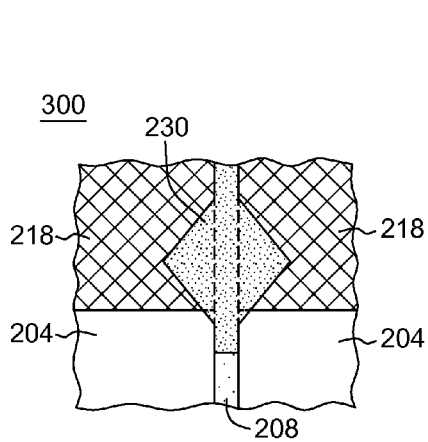
Figure 14:
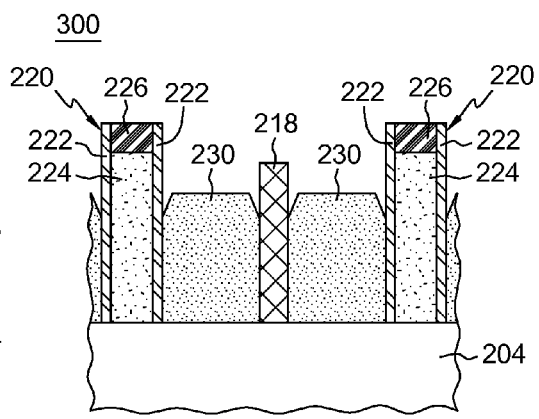
Figure 15:
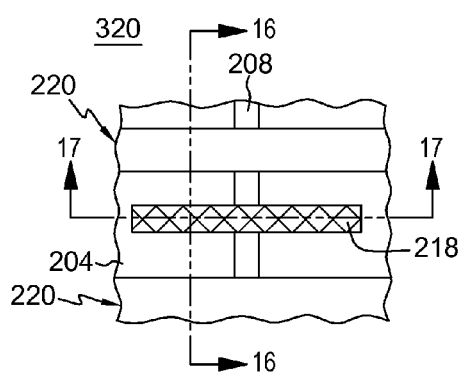
Figure 16:
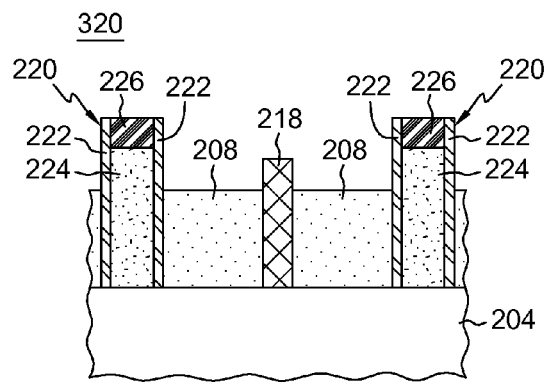
Figure 17:
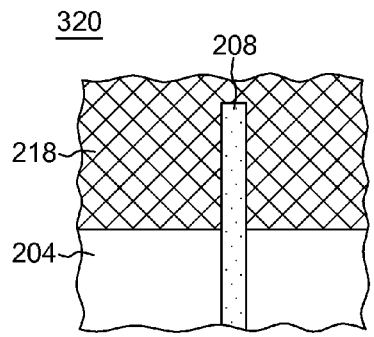
Figure 18:
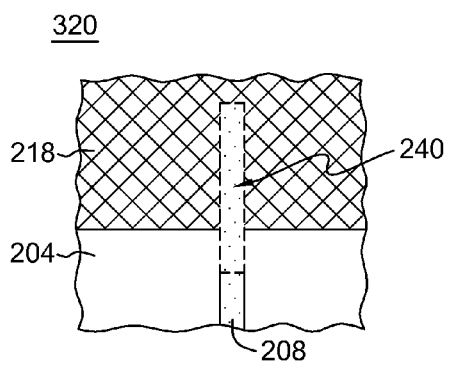
Figure 19:
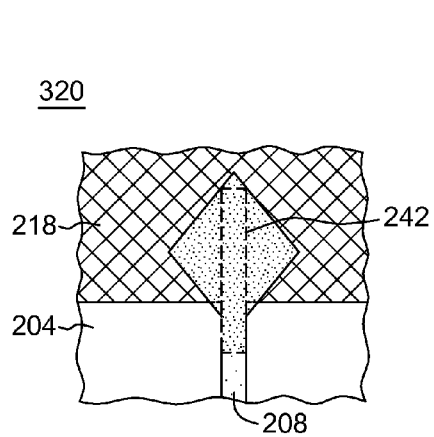
Figure 20:
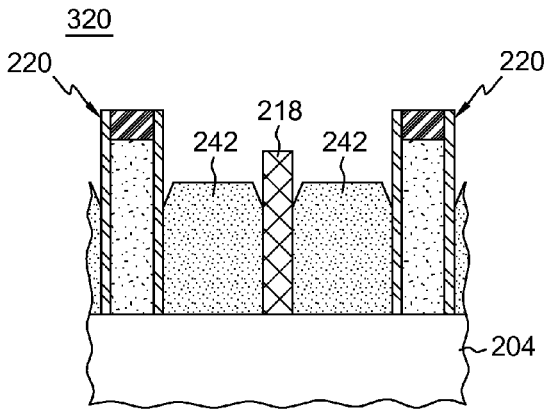
Figure 21:
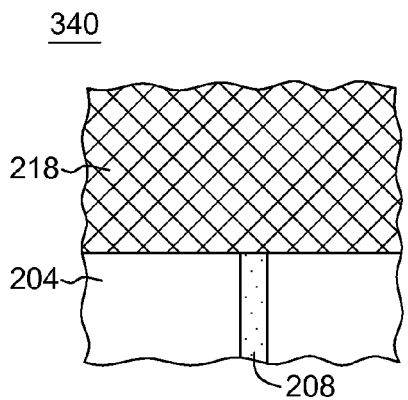
Figure 22:
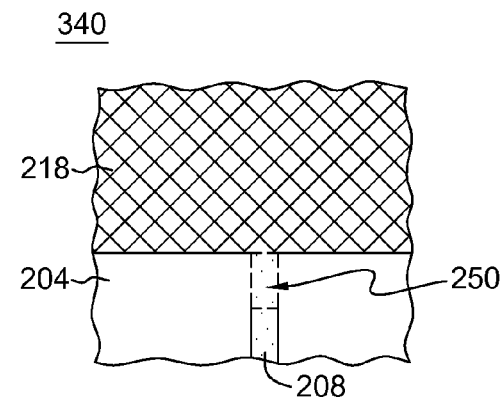
Figure 23:
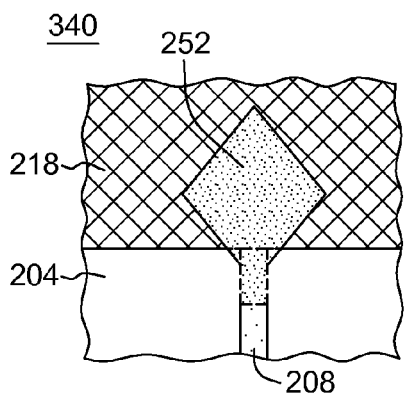
Figure 24:
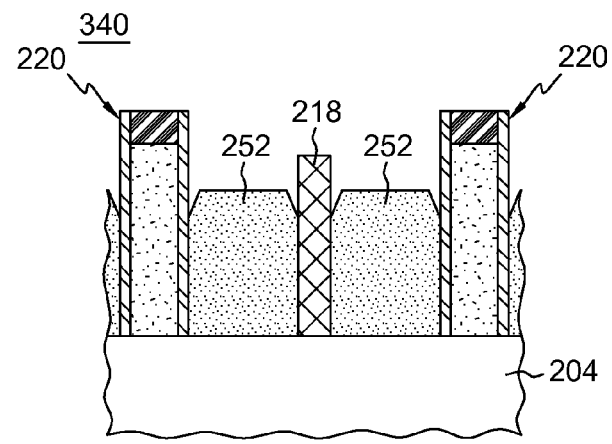
Figure 25:
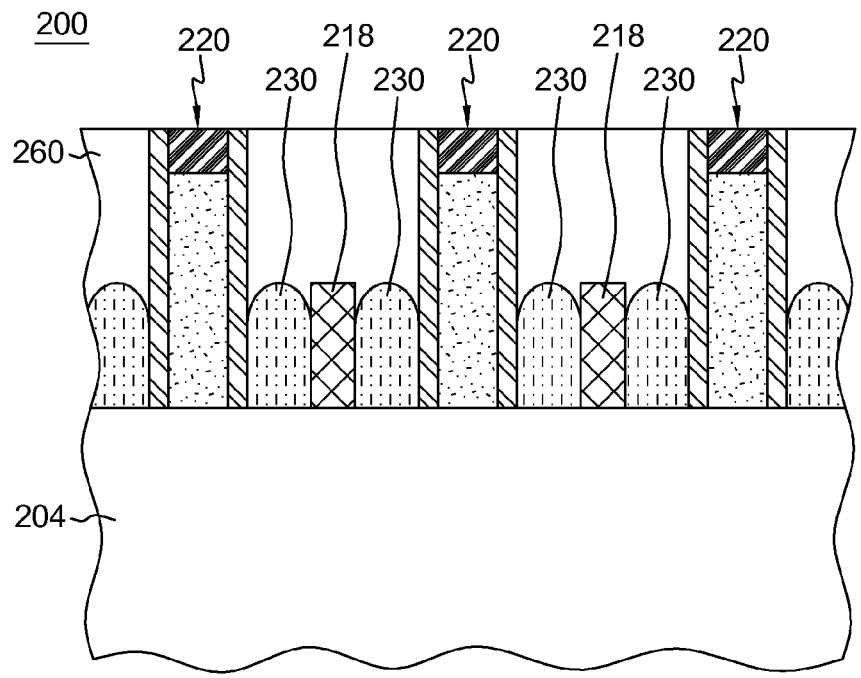
Figure 26:
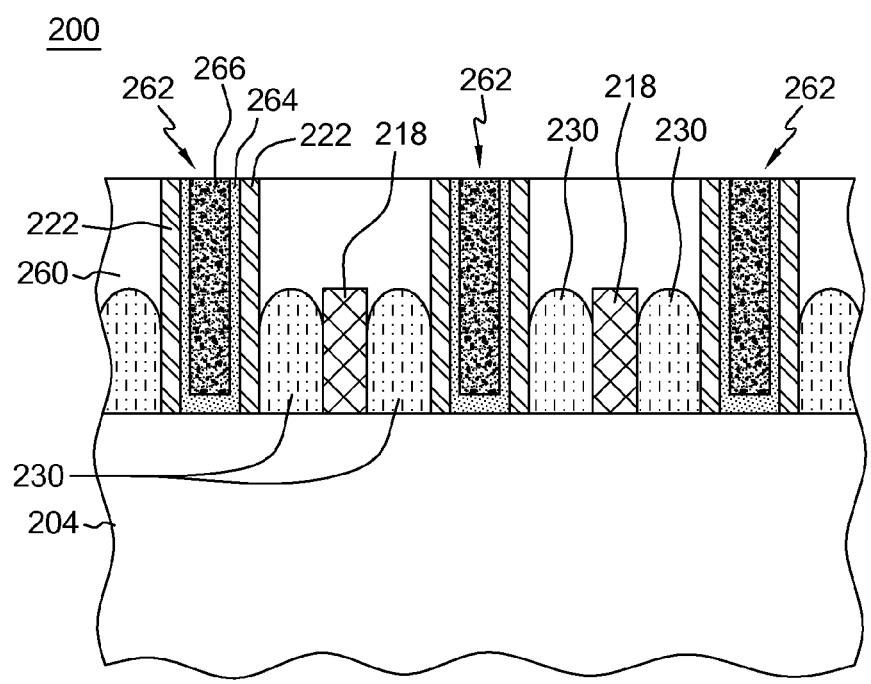
Figure 27:
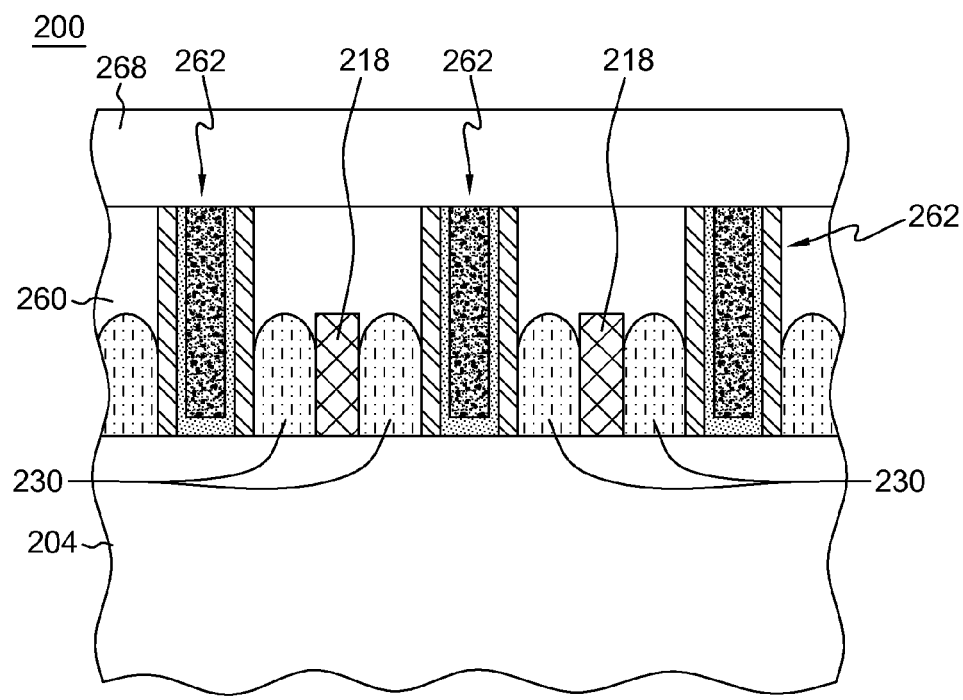
Figure 28:
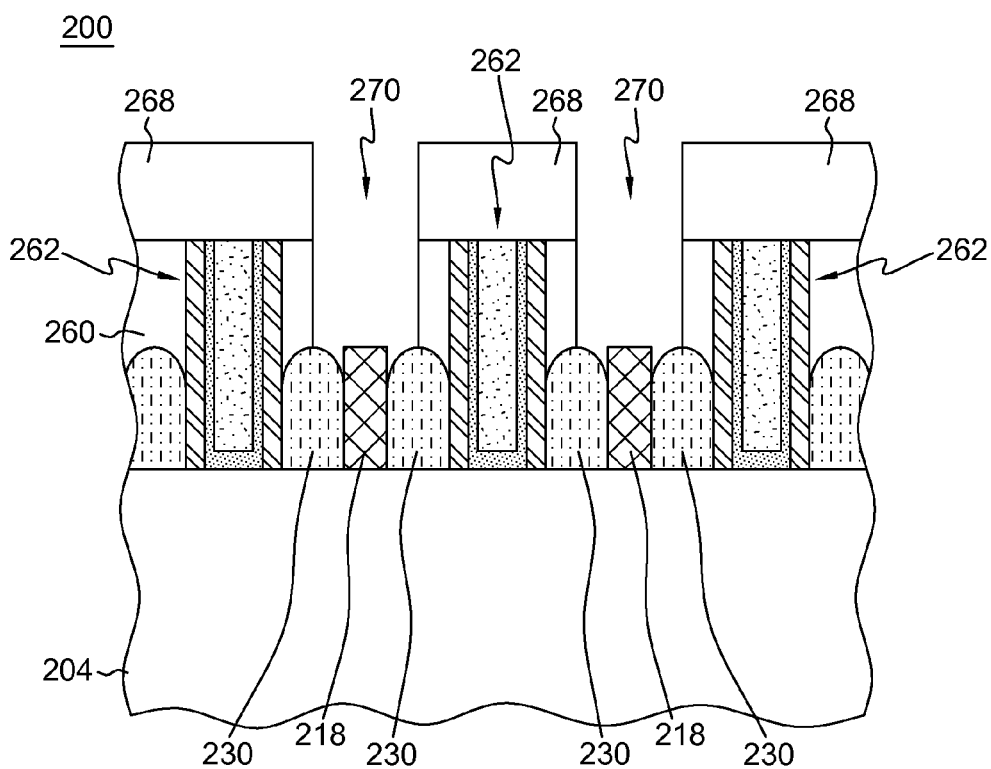
Figure 29:
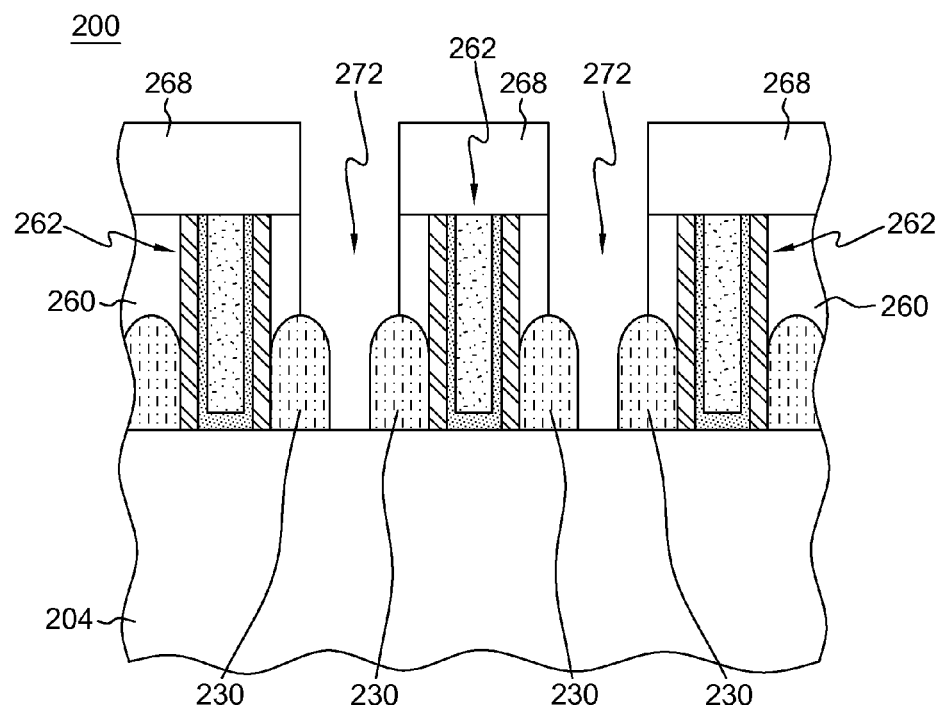
Figure 30:
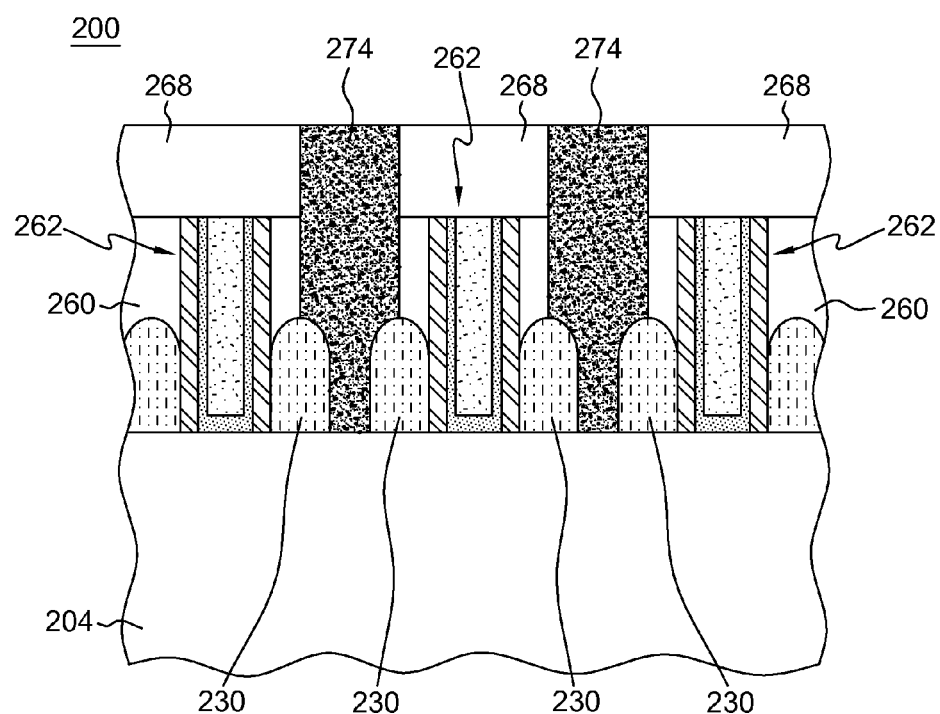

FIG. 3 depicts a top view of the semiconductor device of FIG. 2, in accordance with one or more aspects of the present invention;

FIG. 4 depicts a top view of the semiconductor device of FIG. 3 after depositing a photoresist layer and performing lithography, in accordance with one or more aspects of the present invention;

FIG. 5 depicts a top view of the structure of FIG. 4 after etching the region not covered by the photoresist layer, in accordance with one or more aspects of the present invention;

FIG. 6 depicts a top view of the structure of FIG. 5 after depositing the sacrificial contact material and planarizing, in accordance with one or more aspects of the present invention;

FIG. 7 depicts a cross-sectional view of the structure of FIG. 6 taken along line 7-7, in accordance with one or more aspects of the present invention;

FIG. 8 depicts the structure of FIG. 7 after forming sacrificial gates, in accordance with one or more aspects of the present invention;

FIG. 9 depicts a top view of a portion of a first embodiment of the structure of FIG. 8, in accordance with one or more aspects of the present invention;

FIG. 10 depicts a first cross-sectional view of the structure of FIG. 9 taken along line 10-10, in accordance with one or more aspects of the present invention;

FIG. 11 depicts a second cross-sectional view of the structure of FIG. 9 taken along line 11-11, in accordance with one or more aspects of the present invention;

FIG. 12 depicts the structure of FIG. 11 after etching to recess the fin, in accordance with one or more aspects of the present invention;

FIG. 13 depicts the structure of FIG. 12 after growing an epitaxial layer between the sacrificial contact and the sacrificial gates, in accordance with one or more aspects of the present invention;

FIG. 14 depicts the structure of FIG. 13 taken along the first cross-sectional view, in accordance with one or more aspects of the present invention;

FIG. 15 depicts a top view of an alternative embodiment of the structure of FIG. 8, in accordance with one or more aspects of the present invention;

FIG. 16 depicts a first cross-sectional view of the structure of FIG. 15 taken along line 16-16, in accordance with one or more aspects of the present invention;

FIG. 17 depicts a second cross-sectional view of the structure of FIG. 15 taken along line 17-17, in accordance with one or more aspects of the present invention;

FIG. 18 depicts the structure of FIG. 17 after etching to recess the fin, in accordance with one or more aspects of the present invention;

FIG. 19 depicts the structure of FIG. 18 after growing an epitaxial layer between the sacrificial contact and the sacrificial gates, in accordance with one or more aspects of the present invention;

FIG. 20 depicts the structure of FIG. 19 taken along the first cross-sectional view, in accordance with one or more aspects of the present invention;

FIG. 21 depicts a second cross-sectional view of an alternative embodiment of the structure of FIG. 15 taken along line 17-17, in accordance with one or more aspects of the present invention;

FIG. 22 depicts the structure of FIG. 21 after etching to recess the fin, in accordance with one or more aspects of the present invention;

FIG. 23 depicts the structure of FIG. 22 after growing an epitaxial layer between the sacrificial contact and the sacrificial gates, in accordance with one or more aspects of the present invention;

FIG. 24 depicts the structure of FIG. 23 taken along the first cross-section view of FIG. 19, in accordance with one or more aspects of the present invention;

FIG. 25 depicts the structure of FIG. 8 after the epitaxial growth is formed between the sacrificial contact and the sacrificial gates as shown in FIGS. 9-24, in accordance with one or more aspects of the present invention;

FIG. 26 depicts the structure of FIG. 25 after removing the hard mask, performing a poly pull on the sacrificial gate, and forming the gate, in accordance with one or more aspects of the present invention;

FIG. 27 depicts the structure of FIG. 26 after depositing an interlayer dielectric layer over the structure, in accordance with one or more aspects of the present invention;

FIG. 28 depicts the structure of FIG. 27 after performing lithography and etching the interlayer dielectric layers to form a portion of the fin contact openings, in accordance with one or more aspects of the present invention;

FIG. 29 depicts the structure of FIG. 28 after etching to remove the sacrificial contacts, in accordance with one or more aspects of the present invention; and FIG. 30 depicts one embodiment of the structure of FIG. 13 taken along line 10-10 in FIG. 9 and FIGS. 19 and 23 taken along line 16-16 in FIG. 15 after depositing and planarizing the metal contact material, in accordance with one or more aspects of the present invention.

DETAILED DESCRIPTION OF THE INVENTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain semiconductor devices, for example, field-effect transistors (FETs), which provide advantages over the above noted, existing semiconductor devices and fabrication processes. Advantageously, the semiconductor device fabrication processes disclosed herein provide for devices with better yield.

Figure 1:
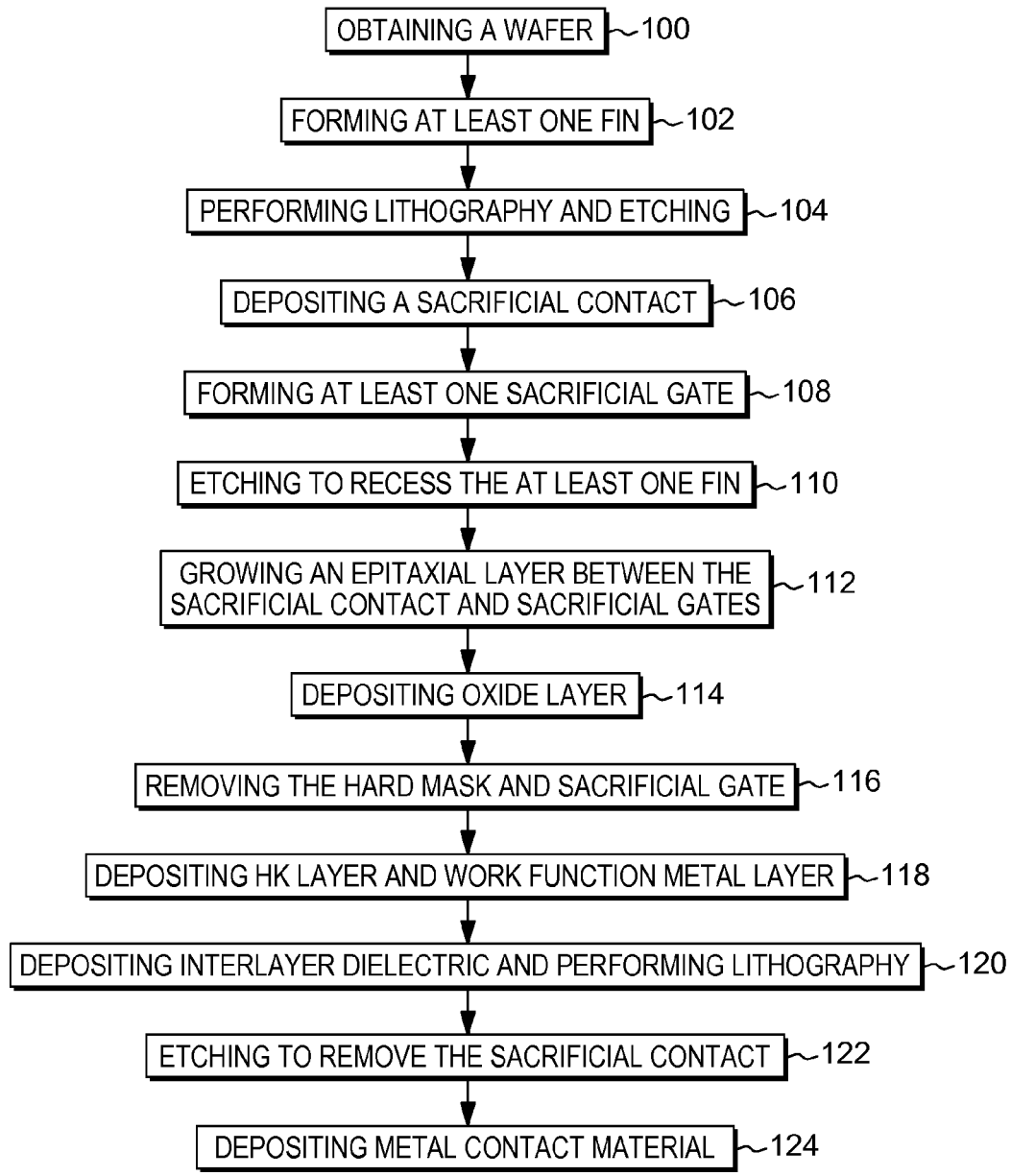
FIG. 1 depicts one embodiment of a method for forming a fin contact for an integrated circuit, in accordance with one or more aspects of the present invention.

In one aspect, in one embodiment, as shown in FIG. 1, the semiconductor device formation process in accordance with one or more aspects of the present invention may include, for instance: obtaining a wafer 100; forming at least one fin on the wafer, depositing an oxide layer, and planarizing 102; performing lithography and etching for spacers 104; depositing a sacrificial contact 106; forming at least one sacrificial gate 108; etching to recess the at least one fin 110; growing an epitaxial layer between the spacers and the at least one sacrificial gate 112; depositing an oxide layer over the device 114; removing the hard mask layer and sacrificial gates 116; depositing a high K layer and work function metal layer 118; depositing an interlayer dielectric layer over the device and performing lithography 120; etching to remove the sacrificial contacts 122; and depositing a metal contact material 124.

FIGS. 2-30 depict, by way of example only, several detailed embodiments of a portion of the FinFET device formation process of FIG. 1 and a portion of an intermediate FinFET structure, in accordance with one or more aspects of the present invention. Note again that these figures are not drawn to scale in order to facilitate understanding of the invention, and that the same reference numerals used throughout different figures designate the same or similar elements.

One detailed embodiment of a portion of the FinFET device formation process of FIG. 1 is depicted, by way of example only, in FIGS. 2-30. FIG. 2 shows a portion of a semiconductor device 200 obtained during the fabrication process. The device 200 may have been processed through initial device processing steps in accordance with the design of the device 200 being fabricated, for example, the device 200 may include, for example, a substrate 202 with at least one local isolation region 204, at least one deep trench isolation (DTI) region 206, and at least one fin 208. The local isolation regions 204 and DTI regions 206 may be, for example, oxide regions. The device 200 may also include hard mask regions 210 positioned over the fins 208, as shown in FIGS. 2 and 3. After the at least one fin 208 and hard mask regions 210 are formed, an oxide layer (not shown) may be deposited over the device 200 and planarization may be performed by, for example, chemical mechanical planarization. It is also contemplated that additional features may be present on the device 200, for example, at least one source region (not shown) and at least one drain region (not shown). The at least one fin 208 may extend between the at least one source region (not shown) and at least one drain region (not shown).

Referring now to FIGS. 2-14 and 25-30, by way of example only, one embodiment of a portion of the FinFET device formation process of FIG. 1 is shown. As shown in FIG. 4, lithography may be performed by, for example, depositing a photoresist layer 212 over the device 200 and patterning the device 200 to form channels 214. The lithography may be performed by direct patterning or reverse sidewall image transfer (SIT). Next, the device 200 may be etched to form spacer openings 216 and the photoresist layer 212 may be removed, as shown in FIG. 5. In one embodiment, etching the spacer openings 216 may include etching only the local isolation regions 204 not covered by the photoresist layer 212. In another embodiment, etching the spacer openings 216 may include etching the local isolation regions 204 and the fin hard mask material 210 not covered by the photoresist layer 212. In yet another embodiment, etching the spacer openings 216 may include etching the local isolation regions 204, the fin hard mask material 210, and the portion of the fin 208 not covered by the photoresist layer 212.

Referring now to FIGS. 6 and 7, a sacrificial contact 218 may then be deposited over the device 200 filling the spacer openings 216 and the device 200 may be planarized. The sacrificial contact 218 may be, for example, a silicon nitride (SiN) material, amorphous carbon, low K material, or high K material. Next, at least one sacrificial gate 220 may be formed on the device 200 by any known gate formation method, as shown in FIG. 8. The at least one sacrificial gate 220 may include spacers 222 positioned on opposite sides of the sacrificial gate material 224 and a mask cap 226 may be positioned over the sacrificial gate material 224 between the spacers 222.

FIGS. 9-14 depict an intermediate structure 300 which is one embodiment of the device 200 including spacer openings 216 that were etched down only into the local isolation regions 204. The intermediate structure 300 is shown in FIGS. 9-11 after formation of at least one sacrificial gate 220. The structure 300 may then be etched to recess the fins 208 and form openings 228, as shown in FIG. 12. The fin 208 may be, for example, recessed below the sacrificial contact 218. A wider opening 228 may optionally be formed by, for example, a single wider etch or two etches where the second etch may widen the opening 228. Once the fin 208 is recessed, epitaxy 230 may be grown between the sacrificial contact 218 and the sacrificial gates 220 in the opening 228, as shown in FIGS. 13 and 14. The epitaxial growth 230 may be, for example, diamond shaped or any other polygonal shape. The epitaxial growth 230 may grow around the sacrificial contact 218 to allow for a recessed contact.

FIGS. 15-20 depict an intermediate structure 320 which is another embodiment of the device 200 including spacer openings 216 that were etched into the local isolation regions 204 and the fin hard mask material 210. The intermediate structure 320 is shown in FIGS. 15-17 after formation of at least one sacrificial gate 220. The structure 320 may then be etched to recess the fin 208 and form openings 240, as shown in FIG. 18. With continued reference to FIG. 18, the fin 208 may be, for example, recessed below the sacrificial contact 218. Once the fin 208 is recessed, epitaxy 242 may be grown between the sacrificial contact 218 and the sacrificial gates 220 in the openings 240, as shown in FIGS. 19 and 20. The epitaxial growth 242 may be grown as, for example, a diamond shape or any other polygonal shape. The epitaxial growth 230 may grow around the sacrificial contact 218 to allow for a recessed contact.

FIGS. 15, 16, and 21-24, depict an intermediate structure 320, 340 which is yet another embodiment of the device 200 including spacer openings 216 that were etched into the local isolation regions 204, the fin hard mask material 210, and the portion of the fin 208. The intermediate structure 320, 340 is shown in FIGS. 15, 16 and 21 after formation of at least one sacrificial gate 220. The structure 340 may then be etched to recess the fin 208 and form openings 250, as shown in FIG. 22. With continued reference to FIG. 22, the fin 208 may be, for example, recessed below the sacrificial contact 218. Once the fin 208 is recessed, epitaxy 252 may be grown between the sacrificial contact 218 and the sacrificial gates 220 in the openings 250, as shown in FIGS. 23 and 24. The epitaxial growth 252 may be grown as, for example, a diamond shape or other polygonal shape. The epitaxial growth 230 may grow around the sacrificial contact 218 to allow for a recessed contact.

After the epitaxial growth 230, 242, 252 is formed, an oxide layer 260 may be deposited over the device 200 and the oxide layer 260 may be planarized by, for example, chemical mechanical planarization (CMP), as shown in FIG. 25. Next, a replacement metal gate process may be performed by any known method. For example, the hard mask 226 may be removed and the sacrificial gate 224 pulled. Then, a high K layer 264 may be deposited into the space between the spacers 222 and a work function metal 266 may be deposited into the space inside of the high K layer 264, as shown in FIG. 26. An interlayer dielectric (ILD) material 268 may then be deposited over the device 200 and planarized, as shown in FIG. 27.

Next, the fin contact may be formed as shown in FIGS. 28-30. Lithography may be performed to pattern the ILD material 268. As shown in FIG. 28, openings 270 may be formed over the fins 208 by etching over the lithography pattern and into the ILD material 268 and the oxide layer 260. Then, as shown in FIG. 29, etching may be performed to remove the sacrificial contact 218 forming openings 272. Next, a contact metal may be deposited over the device 200 to fill the openings 272 and planarization may be performed to form the fin contacts 274, as shown in FIG. 30.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   obtaining a wafer with at least one isolation region;
   forming at least one fin on the wafer;
   forming at least one sacrificial contact over at least a portion of the at least one fin;
   forming at least one sacrificial gate over the at least one isolation region and parallel to the at least one sacrificial contact;
   etching to recess the at least one fin;
   growing an epitaxial material over the at least one fin;
   performing replacement metal gate to the at least one sacrificial gate;
   depositing an interlayer dielectric layer over the wafer; and
   forming at least one fin contact, wherein at least a portion of the at least one fin contact extends through the epitaxial material and contacts at least a portion of the at least one isolation region.

2. The method of claim 1, wherein forming at least one sacrificial contact comprises:
performing lithography on the wafer;
etching at least one opening into at least a portion of the at least one isolation region; and
depositing a sacrificial contact material into the at least one opening to form the at least one sacrificial contact.

3. The method of claim 1, wherein the at least one sacrificial contact overlaps at least a portion of the at least one fin.

4. The method of claim 2, wherein etching the at least one opening further comprises:
etching at least a portion of a fin hard mask material over the at least one fin and at least a portion of the fin.

5. The method of claim 2, wherein the at least one fin includes at least one fin hard mask over the at least one fin.

6. The method of claim 5, wherein etching the at least one opening comprises:
etching the at least one isolation region; and
etching the at least one fin hard mask.

7. The method of claim 5, wherein etching the at least one opening comprises:
etching the at least one isolation region;
etching the at least one fin hard mask; and
etching a portion of the at least one fin.

8. The method of claim 1, wherein forming at least one fin contact comprises:
performing lithography over the interlayer dielectric layer;
etching the interlayer dielectric layer, oxide material, and sacrificial contact material to remove the spacers and form contact openings; and
depositing a metal material into the contact openings.

9. The method of claim 1, wherein the at least one sacrificial contact is selected from the group consisting of a silicon nitride material, an amorphous carbon material, a low K material, and a high K material.

10. The method of claim 1, wherein the epitaxial material is grown between the at least one sacrificial contact and the at least one sacrificial gate.

11. The method of claim 10, wherein the epitaxial material is grown in a diamond shape.

12. The method of claim 1, further comprising:
depositing an oxide material over the wafer after growing the epitaxial material; and
planarizing the device.

13. The method of claim 2, wherein the at least one opening is a widened opening.

* * * * *